(12) United States Patent
Tanizaki et al.

(10) Patent No.: US 6,288,956 B1
(45) Date of Patent: Sep. 11, 2001

(54) SEMICONDUCTOR DEVICE HAVING TEST FUNCTION

(75) Inventors: Tetsushi Tanizaki; Tetsuo Kato; Mikio Asakura; Yasuhiro Konishi; Takayuki Miyamoto, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/477,717

(22) Filed: Jan. 5, 2000

(30) Foreign Application Priority Data

Jun. 28, 1999 (JP) .................................................. 11-182334

(51) Int. Cl.[7] ..................................................... G11C 11/40
(52) U.S. Cl. ................ 365/201; 365/189.05; 365/230.08
(58) Field of Search ............................... 365/201, 189.05, 365/230.08

(56) References Cited

U.S. PATENT DOCUMENTS

| 5,400,290 | 3/1995 | Suma et al. . |
| 5,528,162 | * 6/1996 | Sato ...................................... 365/201 |
| 5,793,685 | 8/1998 | Suma . |
| 5,898,316 | 4/1999 | Kato et al. . |

* cited by examiner

Primary Examiner—Terrell W. Fears
(74) Attorney, Agent, or Firm—McDermott, Will & Emery

(57) ABSTRACT

A semiconductor device according to the present invention includes a plurality of test mode circuits. Each test mode circuit includes a plurality of decode circuits decoding an input signal and a plurality of latch circuits. Each decode circuit generates a test mode signal. The test mode signals are held in the latch circuits. Each test mode circuit further includes decode circuits outputting a group reset signal for resetting a corresponding latch circuit. Thus, a plurality of test mode signals can be combined arbitrarily and serially.

11 Claims, 4 Drawing Sheets

SEMICONDUCTOR DEVICE HAVING TEST FUNCTION

BACKGROUND OF THE INVENTION

1. Field of the Invention

The present invention relates to semiconductor devices and more particularly to a semiconductor device having a function of setting a test mode.

2. Description of the Background Art

Conventionally, a semiconductor device has a test mode circuit to set a test mode which is an operation mode for test facilitation. When a prescribed test mode is set by the test mode circuit, the semiconductor device operates according to the prescribed test mode. Thus, the inner state of the semiconductor device can be tested easily.

However, the conventional test mode circuit in a semiconductor device is formed so that a prescribed test mode is set by one setting operation. It is therefore impossible to freely combine several test modes (test operations) by a test program.

When the conventional test mode circuit is used, a test mode is entered by one setting operation and therefore a false test mode may be set according to the state of an unexpected input signal.

SUMMARY OF THE INVENTION

Therefore, the present invention provides a semiconductor device capable of combining and setting a plurality of test modes.

According to one aspect of the present invention, a semiconductor device includes an internal circuit and a plurality of test mode setting circuits receiving an input signal, the plurality of test mode setting circuits each including a test mode signal generation circuit outputting a test mode signal for setting a test mode of the internal circuit according to the input signal, and a hold circuit holding a state of the test mode signal.

Preferably, the plurality of test mode setting circuits are divided into a plurality of groups, the plurality of groups further each include a reset circuit resetting a state of a corresponding hold circuit according to the input signal.

Preferably, a prescribed number of test mode setting circuits of the plurality of test mode setting circuits correspond to test modes conflicting with each other, and the prescribed number of test mode setting circuits each operate so that, when one test mode of the conflicting test modes is set, remaining at least one conflicting test mode is not set.

According to the above described semiconductor device, a plurality of test mode signals can be set serially and in an arbitrary combination. Further, test mode signals can be reset on a group basis. Furthermore, serial setting of conflicting test mode signals can be prevented. Thus, a test program is set more freely, thereby enabling more accurate testing.

The present invention also provides a semiconductor device capable of reliably implementing a desirable test mode.

According to another aspect of the present invention, a semiconductor device includes an internal circuit, a plurality of test mode setting circuits receiving an input signal, and a test mode detection circuit for generating a test mode enable signal according to the input signal, the plurality of test mode setting circuits each including a test mode signal generation circuit responsive to the test mode enable signal for outputting a test mode signal for setting a test mode of the internal circuit according to the input signal, and a hold circuit holding a state of the test mode signal.

Preferably, the plurality of test mode setting circuits are divided into a plurality of groups, and the plurality of groups further each include a reset circuit responsive to the test mode enable signal for resetting a state of a corresponding hold circuit according to the input signal.

Preferably, a prescribed number of test mode setting circuits of the plurality of test mode setting circuits correspond to test modes conflicting with each other, and the prescribed number of test mode setting circuits each operate so that, when one test mode of the conflicting test modes is set, remaining at least one conflicting test mode is not set.

According to the above described semiconductor device, the test mode detection circuit is provided to detect a test mode, and therefore a plurality of test mode signals can be set serially and in an arbitrary combination. As a result, a combination of arbitrary test modes can be implemented without setting a false test mode signal. At this time, test mode signals can be reset on a group basis. Furthermore, serial setting of conflicting test mode signals can be prevented. Thus, a desirable test can be implemented reliably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
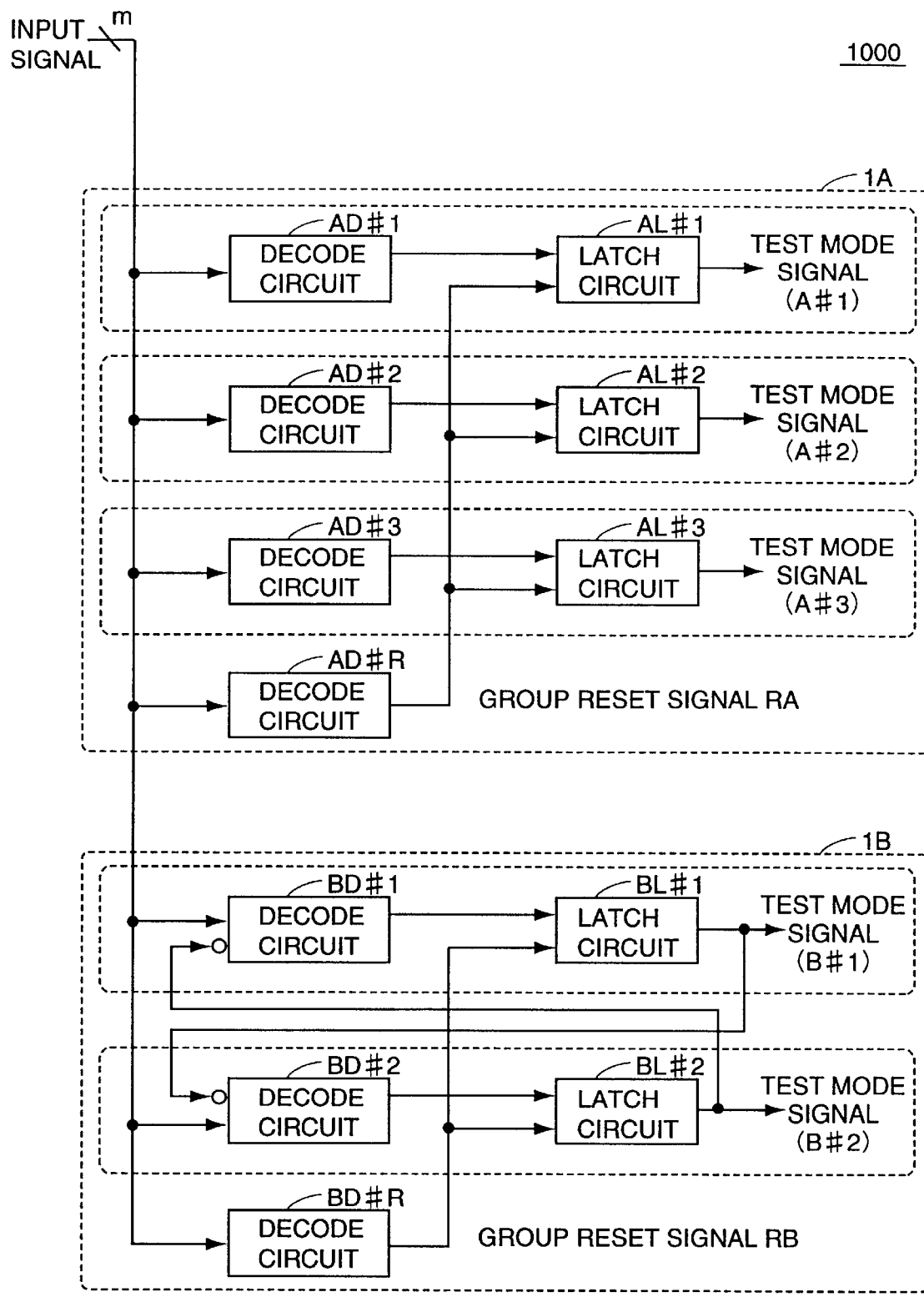
FIG. 1 is a diagram for describing a configuration of a main part of a semiconductor device 1000 in a first embodiment of the present invention.

The embodiments of the present invention will be described in detail with reference to the drawings. The same elements are denoted by the same or similar reference characters and description thereof will not be repeated.

First Embodiment

A semiconductor device 1000 according to a first embodiment of the present invention will be described. Semiconductor device 1000 in the first embodiment can serially set a plurality of test mode signals.

Referring to FIG. 1, a configuration of a main part of semiconductor device 1000 in the first embodiment will be described. Semiconductor device 1000 shown in FIG. 1 includes a plurality of decoders and a plurality of latch circuits. The plurality of decoders and the plurality of latch circuits are divided into a plurality of groups (test mode circuits). In FIG. 1, test mode circuits 1A, 1B are representatively shown.

Referring to FIG. 1, test mode circuit 1A includes decode circuits AD#1, AD#2, AD#3, AD#R, and latch circuits AL#1, AL#2, AL#3. Latch circuits AL#1, AL#2, AL#3 are provided corresponding to decode circuits AD#1, AD#2, AD#3.

Decode circuits AD#1, AD#2, AD#3, AD#R each decode an m-bit input signal. Latch circuits AL#1, AL#2, AL#3 latch outputs of corresponding decode circuits and output test mode signals A#1, A#2, A#3, respectively. Decode circuit AD#R outputs a group reset signal RA for resetting the states of latch circuits AL#1, AL#2, AL#3.

Test mode circuit 1B includes decode circuits BD#1, BD#2, and latch circuits BL#1, BL#2. Latch circuits BL#1, BL#2 are provided corresponding to decode circuits BD#1, BD#2.

Decode circuits BD#1, BD#2 each decode an m-bit input signal. Conflicting test mode signals B#2, B#1 are associated with decode circuits BD#1, BD#2. In other words, exclusive processing is carried out so that one test mode signal is at an enable state while the other is not.

Latch circuits BL#1, BL#2 latch outputs of corresponding decode circuits and output test mode signals B#1, B#2, respectively. Decode circuit BD#R receives an m-bit input signal and outputs a group reset signals RB for resetting the states of latch circuits BL#1, BL#2.

Figure 2:
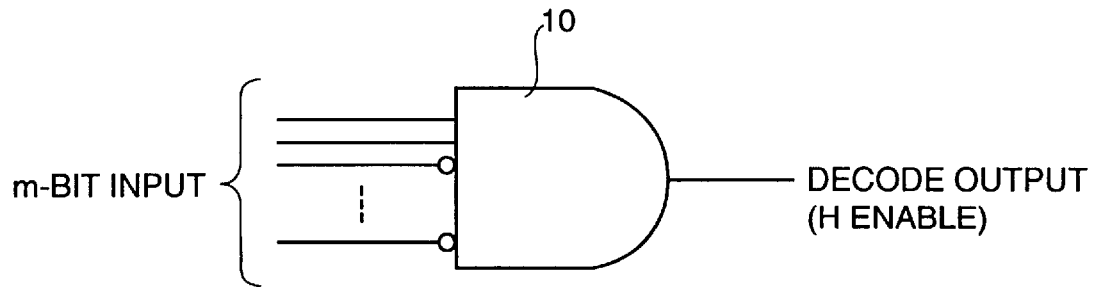
FIGS. 2 and 3 each show one example of a configuration of the decode circuit included in the test mode circuit.
Figure 3:
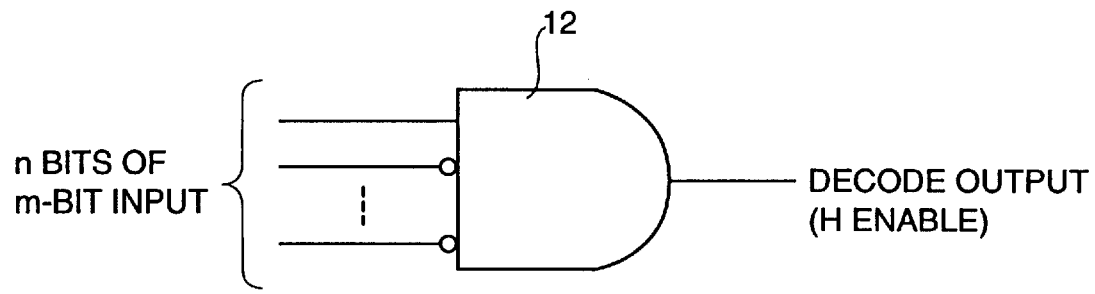

Examples of the circuit configuration of the decode circuit included in the test mode circuit are shown in FIGS. 2 and 3. A logic circuit 10 shown in FIG. 2 outputs an enable state as a decode output when the m-bit input signal is at a prescribed state (H/L). A logic circuit 12 shown in FIG. 3 receives n bits (m>n) of the m-bit input signal as an input, and outputs an enable state as a decode output when they are at a prescribed state (H/L). In this case, the state of bits other than the n bits of the m-bit input signals does not influence the decode output.

Decode circuits BD#1, BD#2 receive conflicting test mode signals B#2, B#1 as input signals in addition to the above described m-bit or n-bit signals.

Figure 4:
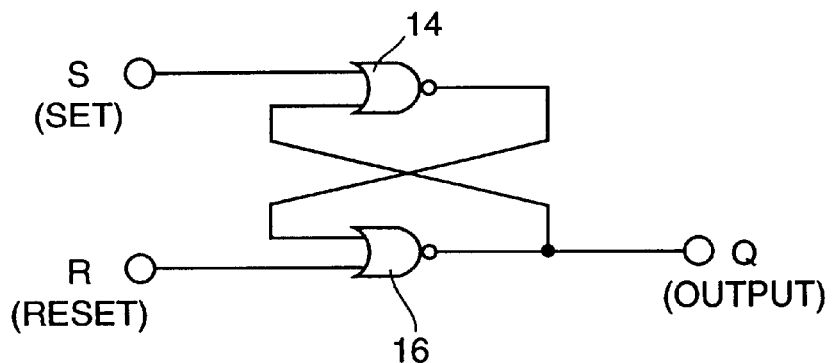
FIGS. 4 and 5 each show one example of a configuration of the latch circuit included in the test mode circuit.
Figure 5:
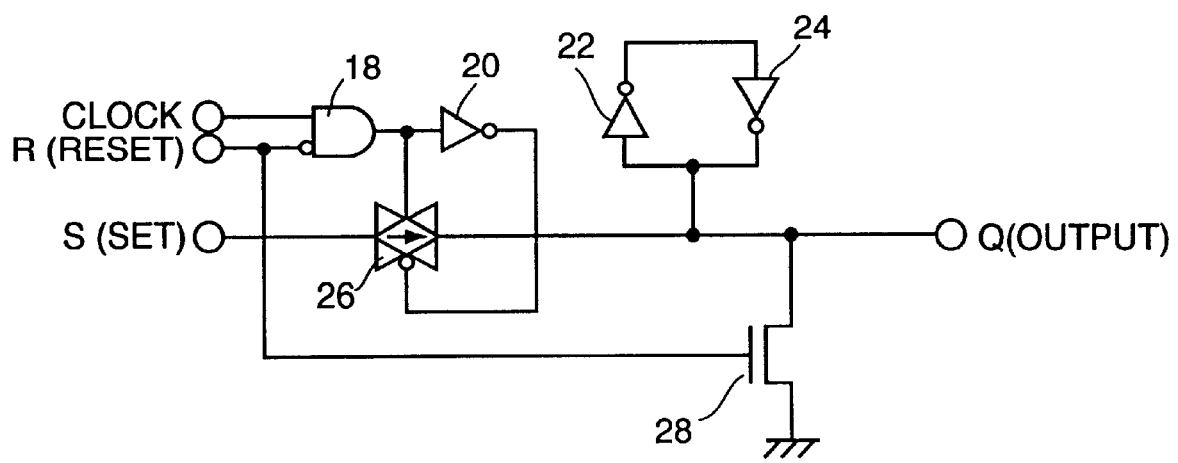

Examples of the circuit configuration of the latch circuit included in the test mode circuit are shown in FIGS. 4 and 5. The circuit shown in FIG. 4 is an RS flip-flop formed of NOR circuits 14, 16. The RS flip-flop receives a group reset signal from reset terminal R and a decode circuit output from set terminal S, and outputs a test mode signal from output terminal Q. When signals at reset terminal R and set terminal S are at the H and L levels, respectively, an L level signal is output from output terminal Q. When signals at reset terminal R and set terminal S are at the L and H levels, respectively, an H level signal is output from output terminal Q. When signals at reset terminal R and set terminal S are at the L level, a signal at output terminal Q maintains its previous value.

The circuit shown in FIG. 5 is a synchronous type latch circuit including a logic circuit 18, inverters 20, 22, 24, a transfer gate 26, and an NMOS transistor 28. Logic circuit 18 receives a clock and a signal at a reset terminal R. Inverter 20 inverts an output of logic circuit 18. Transfer gate 26 outputs a signal at set terminal S to output terminal Q in response to outputs of logic circuit 18 and inverter 20. A latch formed of inverters 22 and 24 is connected to output terminal Q. NMOS transistor 28 is connected between output terminal Q and ground potential and it receives, at its gate, a signal at reset terminal R. A logic operation of the circuits shown in FIG. 5 is the same as the circuit shown in FIG. 4.

Referring to FIG. 1, when the m-bit input signal is a code for setting a test mode signal A#1, a decoded result in decode circuit AD#1 is latched by latch circuit AL#1, and test mode signal A#1 changes from a disable state (L level, for example) to an enable state (H level, for example).

Even when the m-bit input signal ceases to be the setting code of test mode signal A#1 thereafter, latch circuit AL;#1 maintains the state and thus test mode signal A#1 maintains the enable state. The basic operation of test mode circuit 1B is the same as test mode circuit 1A.

In this manner, the test mode circuit maintains the state of a test mode signal even if it newly sets another test mode signal. That is, each test mode circuit can set a plurality of test mode signals in a serial manner. Therefore, each test mode circuit can implement a combination of arbitrary test modes. Further, test mode signals can be reset on a group basis by the above described group reset signals.

It is assumed as an example that a device test is carried out by setting the test mode signals in order of test mode signals A#1→A#3→B#1 according to an input signal. If a test mode corresponding to test mode signal B#1 is to be implemented after testing, test mode signals A#1, A#3 are reset in the following procedure.

First, an m-bit input signal for resetting test mode circuit 1A is applied. In response, decode circuit AD#R outputs group reset signal RA for resetting the states of latch circuits. Thus, all latch circuits AL#1 to AL#3 are reset. As a result, all test mode signals A#1 to A#3 output from test mode circuit 1A are reset (disenabled).

If conflicting test mode signals are serially set, however, testing operation fails and accurate test determination is prevented. Therefore, by associating conflicting test mode signals B#2, B#1 with decode circuits BD#1, BD#2, respectively, as shown in test mode circuit 1B, serial setting of conflicting test mode signals is prevented.

According to semiconductor device 1000 in the first embodiment, a plurality of test mode signals can thus be set in a serial manner. Further, test mode signals can be reset on a group basis. Furthermore, serial setting of conflicting test mode signals can be prevented. As a result, a program for testing semiconductor devices is set more freely, thereby enabling more accurate testing.

Second Embodiment

A semiconductor device 2000 in a second embodiment of the present invention will be described. Semiconductor device 2000 in the second embodiment sets a test mode in two-stage procedure.

Figure 6:
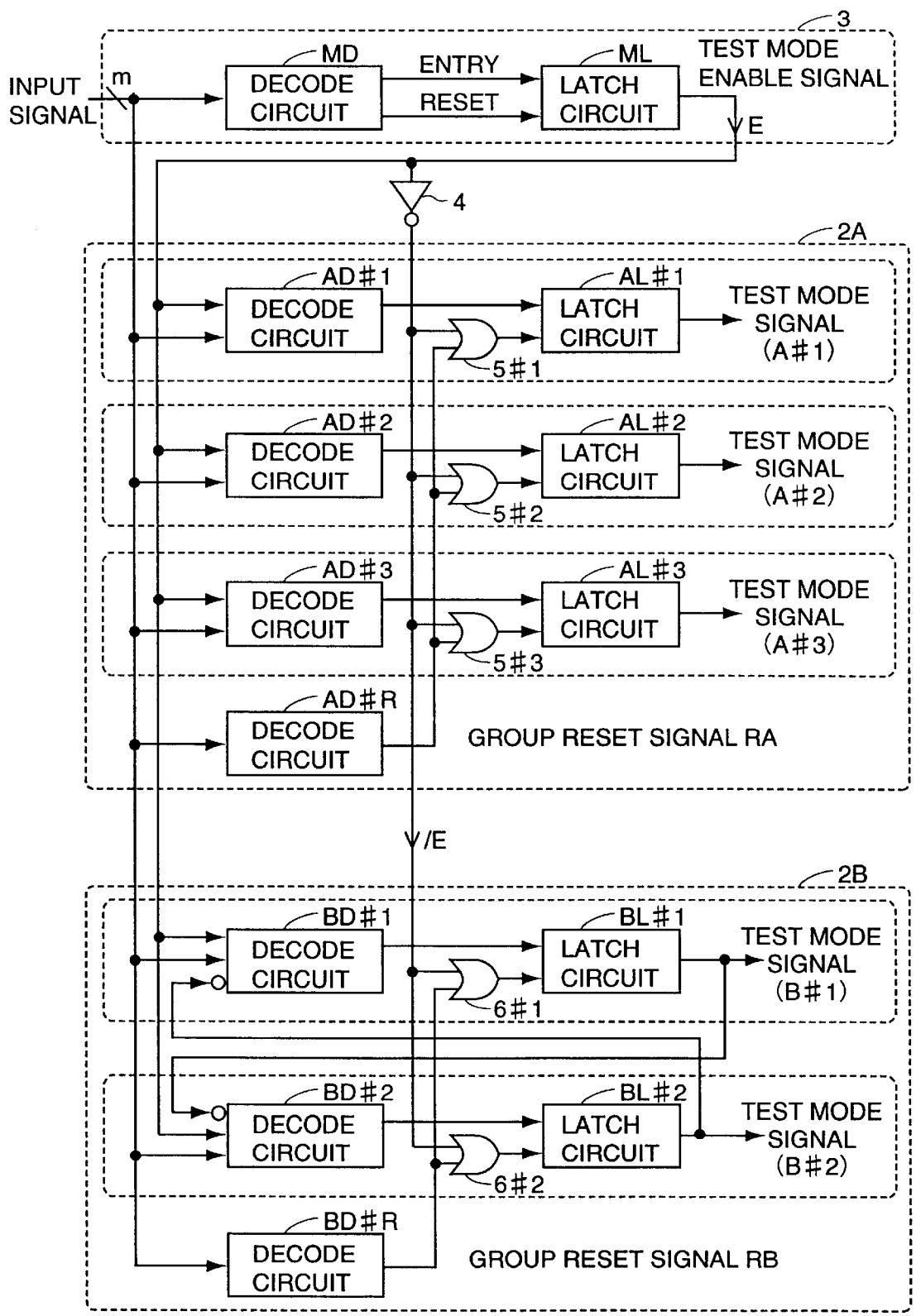
FIG. 6 is a diagram for describing a configuration of a main part of a semiconductor device 1200 in a second embodiment of the present invention.

Referring to FIG. 6, a configuration of a main part of semiconductor device 2000 in the second embodiment will be described. Semiconductor device 2000 shown in FIG. 6 includes a plurality of test mode circuits, and a test mode detection circuit 3 detecting if a test mode is entered or reset. In FIG. 6, test mode circuits 2A, 2B are representatively shown.

Test mode detection circuit 3 includes a decode circuit MD and a latch circuit ML. Decode circuit MD decodes an m-bit input signal and outputs an entry signal (for entering the test mode) or a reset signal (for resetting the test mode). Latch circuit ML latches an output of decode circuit MD and outputs a test mode enable signal E.

Test mode circuit 2A includes decode circuits AD#1, AD#2, AD#3, AD#R, latch circuits AL#1, AL#2, AL#3, and OR circuit 5#1, 5#2, 5#3. Latch circuits AL#1, AL#2, AL#3 are provided corresponding to decode circuits AD#1, AD#2, AD#3. OR circuits 5#1, 5#2, 5#3 are provided corresponding to latch circuits AL#1, AL#2, AL#3.

In the second embodiment, decode circuits AD#1, AD#2, AD#3 each decode the m-bit input signal in response to test mode enable signal E. When corresponding m-bit input signal is input and test mode enable signal E attains an enable state, each test mode signal is enabled. Latch circuits AL#1, AL#2, AL#3 latch outputs of corresponding decode circuits and output test mode signals A#1, A#2, A#3, respectively.

Decode circuit AD#R decodes the m-bit input signal and outputs a group reset signal RA for resetting the states of latch circuits AL#1, AL#2, AL#3. OR circuits 5#1, 5#2, 5#3 receive group reset signal RA and also receive an inverted signal /E of test mode enable signal E through an inverter 4.

When test mode enable signal E is at a disenable state (L level) or group reset signal RA is at an enable state (H level), a latch circuit is reset.

Test mode circuit 2B includes decode circuits BD#1, BD#2, BD#R, latch circuits BL#1, BL#2, and OR circuits 6#1, 6#2. Latch circuits BL#1, BL#2 are provided corresponding to decode circuits BD#1, BD#2. OR circuits 6#1, 6#2 are provided corresponding to latch circuits BL#1, BL#2.

In the second embodiment, decode circuits BD#1, BD#2 operate in response to test mode enable signal E. When corresponding m-bit input signal is input and test mode enable signal E is at an enable state, each test mode signal is enabled. Further, conflicting test mode signals B#2, B#1 are associated with decode circuits BD#1, BD#2, respectively, as described above. Thus, exclusive processing is carried out so that one test mode signal is at an enable state while the other is not. Latch circuits BL#1, BL#2 latch outputs of corresponding decode circuits and output test mode signals B#1, B#2, respectively.

Decode circuit BD#R decodes the m-bit input signal and outputs a group reset signal RB for resetting the state of a latch circuit. OR circuits 6#1, 6#2 receive group reset signal BD and an inverted signal /E of test mode enable signal E.

When test mode enabled signal E is at a disenabled state (L level) or group reset signal RB is at an enabled state (H level), latch circuits BL#1, BL#2 are reset.

In other words, when test mode enabled signal E is at a disenabled state, test mode signals are not set even if the m-bit input signal corresponding to one test mode signal is input.

In the second embodiment, inverted signal /E of test mode enabled signal E is input to latch circuits of all test mode circuits. When an m-bit input signal which disenables (reset) test mode enable signal E is input, therefore, the test mode is ended and all test mode signals are reset.

Although the configuration example of each decode circuit is as described with respect to FIGS. 2 and 3, decode circuits AD#1, AD#2, AD#3 in the second embodiment receive test mode enable signal E at their inputs in addition to the above described m-bit or n-bit signal. Further, decode circuits BD#1, BD#2 receive test mode enabled signal E at their inputs in addition to the above described m-bit or n-bit signal and conflicting test mode signals.

According to semiconductor device 2000 in the second embodiment, the test mode detection circuit is provided and thus setting of a false test mode signal can be prevented. Therefore, a desirable test can be implemented reliably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an internal circuit; and
    a plurality of test mode setting circuits receiving an input signal,
    said plurality of test mode setting circuits each including
        a test mode signal generation circuit generating a test mode signal for setting a test mode of said internal circuit according to said input signal, and
        a hold circuit holding a state of said test mode signal.

2. The semiconductor device according to claim 1, wherein
    said plurality of test mode setting circuits are divided into a plurality of groups, and
    said plurality of groups further each include a reset circuit resetting a state of a corresponding hold circuit according to said input signal.

3. The semiconductor device according to claim 1, wherein
    a prescribed number of test mode setting circuits of said plurality of test mode setting circuits correspond to test modes conflicting with each other, and
    said prescribed number of test mode setting circuits each operate so that, when one test mode of the conflicting test modes is set, remaining at least one conflicting test mode is not set.

4. The semiconductor device according to claim 2, wherein
    said test mode signal generation circuit includes a first decoder receiving said input signal and outputting a corresponding test mode signal, and
    said reset circuit includes a second decoder receiving said input signal and outputting a reset signal for resetting said corresponding hold circuit.

5. The semiconductor device according to claim 3, wherein
    said test mode signal generation circuit includes a decoder receiving said input signal and outputting a corresponding test mode signal, and
    said decoder included in each of said prescribed number of test mode setting circuits receives said input signal and a test mode signal corresponding to said remaining conflicting test mode.

6. A semiconductor device, comprising:
    an internal circuit;
    a plurality of test mode setting circuits receiving an input signal; and
    a test mode detection circuit generating a test mode enable signal according to said input signal,
    said plurality of test mode setting circuits each including
        a test mode signal generation circuit responsive to said test mode enable signal for generating a test mode signal for setting a test mode of said internal circuit according to said input signal, and
        a hold circuit holding a state of said test mode signal.

7. The semiconductor device according to claim 6, wherein
    said plurality of test mode setting circuits are divided into a plurality of groups, and
    said plurality of groups further each include a reset circuit responsive to said test mode enable signal for resetting a state of a corresponding hold circuit according to said input signal.

8. The semiconductor device according to claim 6, wherein
    a prescribed number of test mode setting circuits of said plurality of test mode setting circuits correspond to test modes conflicting with each other, and
    said prescribed number of test mode setting circuits each operate so that, when one test mode of the conflicting test modes is set, remaining at least one conflicting test mode is not set.

9. The semiconductor device according to claim 7, wherein said test mode detection circuit includes a first decoder decoding said input signal, and a circuit receiving an output of said first decoder, outputting said test mode enable signal and holding a state of said test mode enable signal, said test mode signal generation circuit includes a second decoder receiving said input signal and said test mode enable signal and outputting a corresponding test mode signal, and said reset circuit includes a third decoder receiving said input signal and outputting a reset signal for resetting said corresponding hold circuit.

10. The semiconductor device according to claim 8, wherein said test mode detection circuit includes a first decoder decoding said input signal, and a circuit receiving an output of said first decoder, outputting said test mode enable signal and holding a state of said test mode enable signal, said test mode signal generation circuit includes a second decoder receiving said input signal and said test mode enable signal and outputting a corresponding test mode signal, and said second decoder included in each of said prescribed number of test mode setting circuits receives said input signal, said test mode enable signal, and a test mode signal corresponding to said remaining conflicting test mode.

11. A semiconductor device, comprising:

an internal circuit; and a plurality of test mode setting circuits receiving an input signal including a plurality of bits, said plurality of test mode setting circuits each including a test mode signal generation circuit generating a test mode signal for setting a test mode of said internal circuit according to said input signal, and a hold circuit holding a state of said test mode signal.

* * * * *